United States Patent
Nakamura et al.

(10) Patent No.: US 7,718,454 B2
(45) Date of Patent: May 18, 2010

(54) METHOD FOR MANUFACTURING A SEMICONDUCTOR LASER

(75) Inventors: Hitoshi Nakamura, Tokyo (JP); Shinji Abe, Tokyo (JP); Harumi Nishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 68 days.

(21) Appl. No.: 12/029,510

(22) Filed: Feb. 12, 2008

(65) Prior Publication Data

US 2008/0199983 A1 Aug. 21, 2008

Related U.S. Application Data

(63) Continuation-in-part of application No. 11/949,976, filed on Dec. 4, 2007, now abandoned.

(30) Foreign Application Priority Data

Feb. 15, 2007 (JP) ............................ 2007-035342
Jan. 10, 2008 (JP) ............................ 2008-002879

(51) Int. Cl.
*H01L 21/00* (2006.01)
(52) U.S. Cl. .................... 438/30; 438/113; 438/460; 257/E21.085; 257/E21.237; 257/E21.238; 257/E21.32; 257/E21.347
(58) Field of Classification Search .................... 438/30, 438/113, 311, 602, 603, 604, 605, 460; 257/E21.085, 257/237, 238, 32, 347
See application file for complete search history.

(56) References Cited

U.S. PATENT DOCUMENTS

| | | | |
|---|---|---|---|
| 5,629,233 A | | 5/1997 | Chand et al. |
| 6,265,727 B1 | * | 7/2001 | Kozodoy et al. ............... 257/21 |
| 6,734,503 B2 | * | 5/2004 | Hata et al. ................... 257/352 |
| 7,041,523 B2 | | 5/2006 | Kawakami et al. |
| 7,271,422 B2 | * | 9/2007 | Hashimoto et al. ............ 257/96 |
| 2007/0121692 A1 | | 5/2007 | Kawakami et al. |

FOREIGN PATENT DOCUMENTS

| | | |
|---|---|---|
| JP | 10-27942 A | 1/1998 |
| JP | 10-242570 A | 9/1998 |
| JP | 2002-64236 A | 2/2002 |
| JP | 2002-64237 A | 2/2002 |
| JP | 2007-180522 A | 7/2007 |

* cited by examiner

*Primary Examiner*—David Nhu
(74) *Attorney, Agent, or Firm*—Leydig, Voit & Mayer, Ltd.

(57) ABSTRACT

A method of manufacturing semiconductor laser device including a GaN wafer includes forming a semiconductor layer on the GaN wafer and on which ridge portions are formed. Grooves are formed in the semiconductor layer such that each groove is disposed in line with the scribe marks, between each of the ridge portions and an upstream scribe mark. The grooves are curved and convex outwardly towards a downstream side, and each groove has an apex on a cleavage line. The side extending from the apex preferably does not form an angle of 60 degrees with respect to a cleavage direction or the cleavage line.

22 Claims, 18 Drawing Sheets

Fig. 15
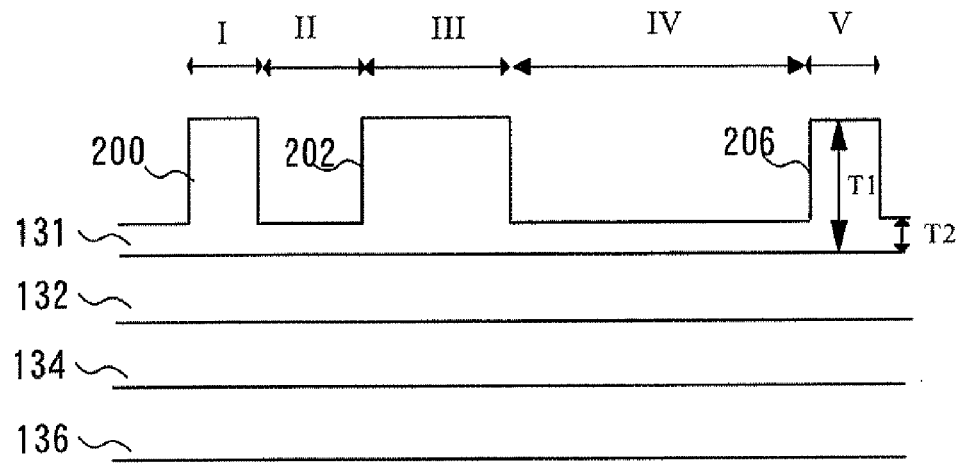
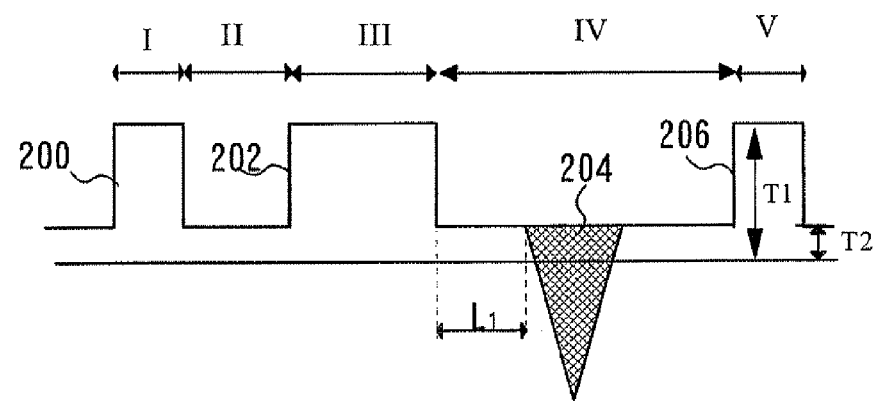
Fig.16A
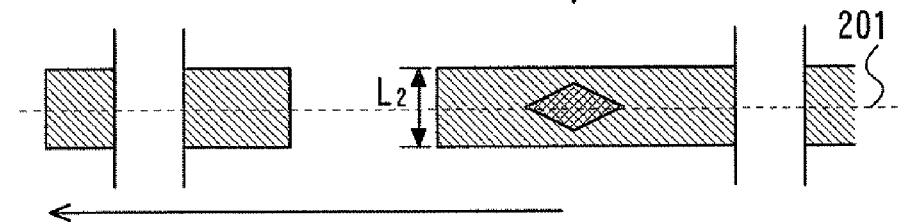
Fig.16B
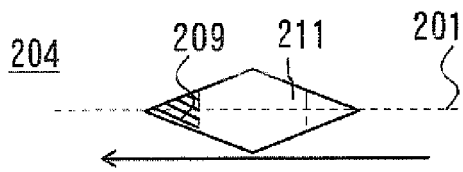
Fig.16C

METHOD FOR MANUFACTURING A SEMICONDUCTOR LASER

FIELD OF THE INVENTION

The present invention relates to a method for manufacturing a semiconductor laser.

BACKGROUND ART

In manufacture of a semiconductor laser, the wafer is cleaved into a plurality of bars by application of appropriate pressure after forming scribe marks on the wafer. However, it has been difficult to cleave a GaN wafer, since GaN crystal is highly stable.

To address this problem, Japanese Patent Laid-Open Publication No. 10-242570 (1998) discloses a wafer cleaving method, which includes forming on the wafer an auxiliary cleavage region layer having notches and cleaving the wafer along these notches. Further, Japanese Patent Laid-Open Publication No. 2002-64237 discloses another wafer cleaving method, which includes forming in the wafer a primary guide trench and a secondary guide trench having a smaller width than the primary guide trench such that the primary guide trench extends from an edge of the wafer to its center portion and these guide trenches are coupled together with their central axes coincident, and then cleaving the wafer along the direction in which these trenches extend.

However, the wafer cleaving methods of the former publications are disadvantageous in that the methods require re-growing a predetermined semiconductor layer region to form the auxiliary cleavage region layer. Further, it is difficult to accurately cleave a GaN wafer in a desired plane by the method of the latter publication, which forms guide trenches only at an edge of the wafer. The reason for that is that a GaN wafer tends to cleave in directions at an angle of 60 degrees with respect to a desired cleavage direction since GaN crystal is in a hexagonal system.

Another conventional method for accurately cleaving a GaN wafer in a desired plane has been to form scribe marks on a per-chip basis instead of forming the scribe marks just at an edge of the wafer. However, if these scribe marks are misaligned, that is, if one of the two facing scribe marks is not on the desired cleavage plane, cleaving the wafer using those scribe marks may result in a cleaved surface having a step-like portion. Such a step-like portion tends to be formed at a position intermediate between the two scribe marks, especially at the ridge portion of the semiconductor laser since the ridge portion is likely to suffer stress concentration. This may result in degraded characteristics of the semiconductor laser since the ridge portion includes the light-emitting region.

FIG. 12 is a schematic cross-sectional view of a ridge portion 101 having a step-like portion, or streaks, formed due to cleavage. This step-like portion is herein referred to as a defective portion 102. In FIG. 12, the defective portion 102 extends into that part 103 of the ridge portion 101 through which the emitted light widens, which adversely affects the characteristics of the light.

The present invention has been devised in view of the above problems. It is, therefore, an object of the present invention to provide a method for manufacture of a semiconductor laser that allows cleaving the wafer in a desired plane.

Another object of the present invention is to provide a method for manufacture of a semiconductor laser that prevents the cleaved surface from having a step-like portion.

Other objects and advantages of the present invention will become apparent from the following description.

SUMMARY OF THE INVENTION

According to a first aspect of the present invention, in a method for manufacturing a semiconductor laser, a semiconductor layer having a plurality of ridge portions is formed on a GaN substrate. A plurality of cuts is formed in the semiconductor layer on the GaN substrate such that the plurality of cuts are spaced at predetermined intervals. At least one groove is formed in the semiconductor layer between each of the plurality of ridge portions and an adjacent one of the plurality of cuts such that the at least one groove is in line with the plurality of cuts. Then, the GaN substrate is cleaved along the plurality of cuts.

According to another aspect of the present invention, in a method for manufacturing a semiconductor laser, a semiconductor layer having a plurality of ridge portions is formed on a GaN substrate. A plurality of cuts is formed in the semiconductor layer on the GaN substrate such that the plurality of cuts are spaced at predetermined intervals and each two adjacent ones of the plurality cuts sandwich one of the plurality ridge portions therebetween. Then, the GaN substrate is cleaved along the plurality of cuts after the following processes. Prior to the cleavage process, a first groove and a second groove are formed in the semiconductor layer between the each two adjacent ones of the plurality of cuts such that the first and second grooves are in line with the plurality of cuts. The first groove is formed between the one of the plurality of ridge portions and the upstream one of the each two adjacent ones of the plurality of cuts relative to a cleavage propagation direction. The second groove is formed between the one of the plurality of ridge portions and the downstream one of the each two adjacent ones of the plurality of cuts relative to the cleavage propagation direction. The first groove as viewed in plan is formed convex outwardly toward a downstream side in the cleavage propagation direction, has an apex on a cleavage line, and sides extending from the apex not forming an angle of 60 degrees with respect to the cleavage propagation direction. The second groove is formed in a rectangular, triangular, or circular shape as viewed in plan, and has no sides forming an angle of 60 degrees with respect to the cleavage propagation direction.

According to another aspect of the present invention, in a method for manufacturing a semiconductor laser, wherein the semiconductor laser includes a wafer having formed thereon a ridge portion, a terrace portion, and a channel portion, wherein the channel portion is formed between the ridge portion and the terrace portion and is lower than the ridge portion and the terrace portion, the method includes the following steps. Providing the wafer step, step for forming a p-type cladding layer having a first thickness over the wafer, step for etching a first predetermined portion and a second predetermined portion of the p-type cladding layer to a second thickness to form the ridge portion, the terrace portion, and the channel portion in such a way that the first predetermined portion becomes the channel portion. The second predetermined portion being located on a cleavage line and to the side of the terrace portion opposite to the ridge portion. Step for forming a scribe mark, or cut, to the side of the second predetermined portion opposite to the ridge portion, the scribe mark being located on the cleavage line and step for cleaving the wafer such that a cleavage crack nucleates at a pointed portion of the scribe mark and propagates through the second predetermined portion toward the ridge portion along the cleavage line. The scribe mark is formed such that a tip of the pointed portion is located on the cleavage line and immediately adjacent the second predetermined portion.

Advantageous Effects of the Invention

Thus, according to the first aspect of the present invention, at least one groove is formed between each ridge portion and an adjacent cut such the groove is in line with the cut. This allows the wafer to be cleaved in a desired plane.

Further, according to the second aspect of the present invention, a first groove and a second groove are formed between each two adjacent cuts such that these grooves are in line with the cuts. This allows the wafer to be cleaved in a desired plane, as well as preventing the cleaved surface from having a step-like portion.

BRIEF DESCRIPTION OF THE DRAWINGS

FIG. 15 partially shows the cross-sectional structure of the wafer after the etching at step 122 of FIG. 13.

FIG. 16A shows a cross-section of the wafer after the scribe mark has been formed at step 124 of FIG. 13.

FIG. 16B is a plan view of the wafer shown in FIG. 16A.

FIG. 16C is an enlarged view of the scribe mark of FIG. 16A,

DETAILED DESCRIPTION OF THE PREFERRED EMBODIMENTS

First Embodiment

Figure 1A:
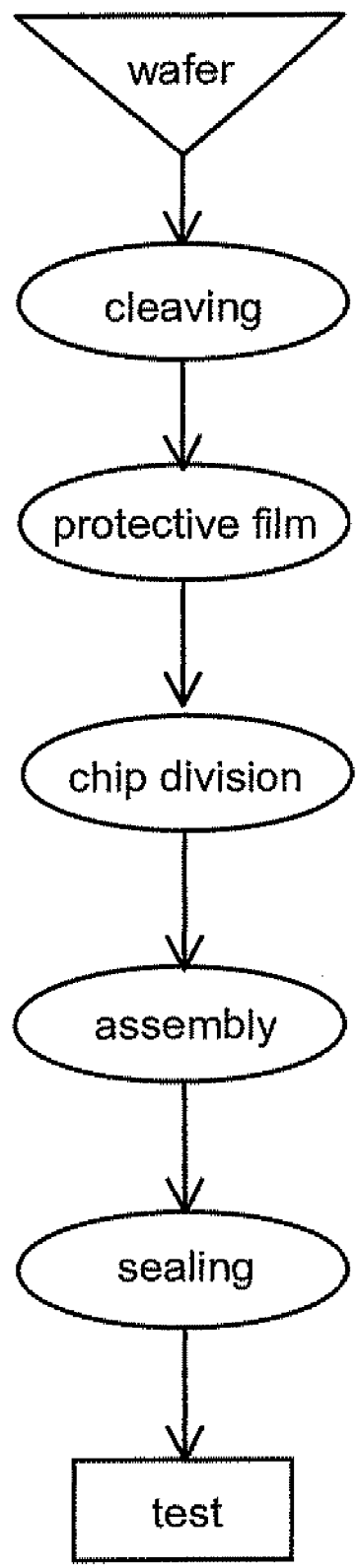
FIG. 1A through FIG. 1E show processes for manufacturing a semiconductor laser device according to a first embodiment of the present invention.

FIG. 1A is a flowchart showing a part of a process for manufacturing a semiconductor laser device according to a first embodiment of the present invention. FIG. 1B through FIG. 1E schematically show a semiconductor laser device during the manufacturing process.

Figure 1B:
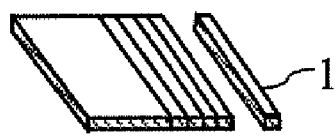
Figure 1C:

The process begins by providing, at step 1, a GaN wafer having a plurality of semiconductor laser devices formed thereon, as shown in FIG. 1A. The GaN wafer is then cleaved into a plurality of bars 1 at step 2 as shown in FIG. 1B. After that, each cleaved edge of the wafer is covered with a protective film at step 3. It should be noted that the protective film might also have a function to control the reflectance. For example, each light emitting front edge may be covered with a protective film having a low reflectance, and each rear edge may be covered with a protective film having a high reflectance. Then, each bar is divided into a plurality of semiconductor laser chips 2 at step 4 as shown in FIG. 1C.

Figure 1D:
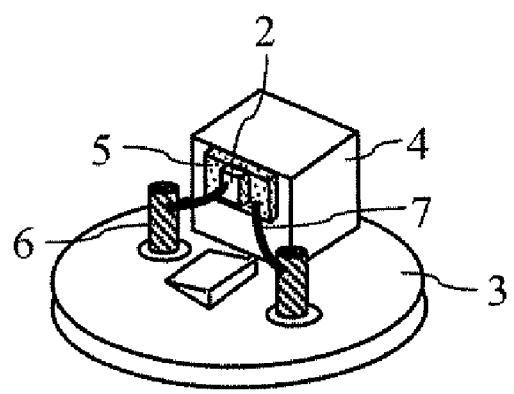

Each semiconductor laser chip 2 is then mounted on a stem 3 for assembly at step 5. More specifically, for example, each semiconductor laser chip 2 is mounted on a sub-mount 5 on a chip mounting base 4 extending from the stem 3, as shown in FIG. 1D. Electrode lead wires 6 are disposed to pass through the stem 3, and the electrode lead wires 6 are electrically connected to the semiconductor laser chip 2 by gold wires 7.

Figure 1E:
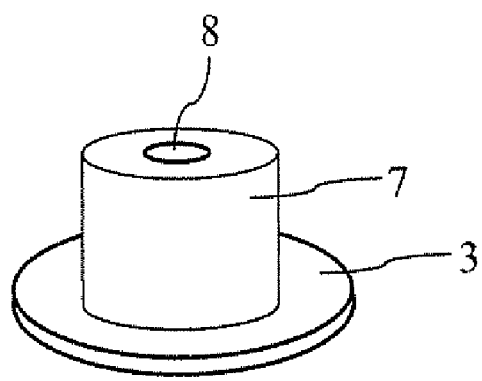

The semiconductor laser chip is then hermetically sealed using a cap 7 at step 6 as shown in FIG. 1E. The stem 3 and the cap 7 form an enclosure. The cap 7 has a window 8 on its top so that light from the semiconductor laser chip can exit the enclosure through the window 8.

The semiconductor laser device manufactured by the above process is subjected to electrical tests, etc. at step 7.

Figure 2A:
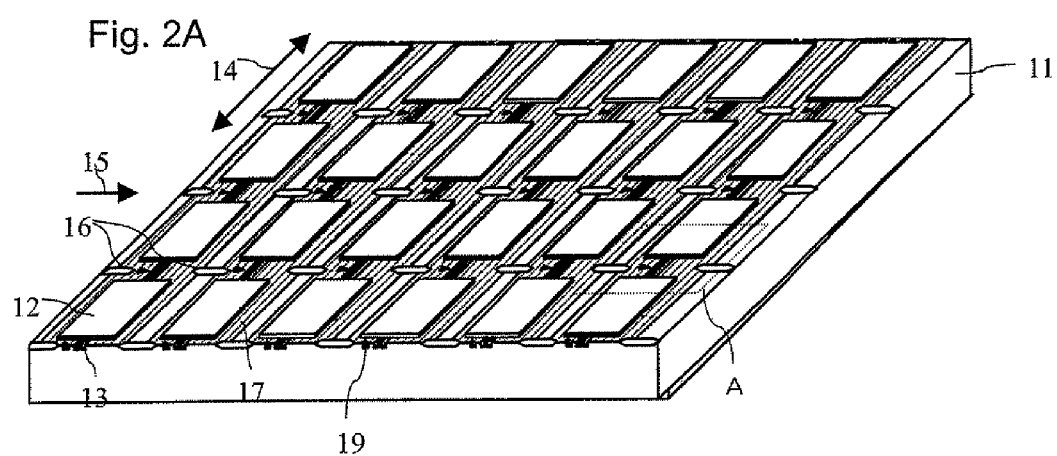
FIG. 2A is a perspective view of a GaN wafer having a plurality of semiconductor laser devices formed thereon in a first embodiment of the present invention.
Figure 2B:
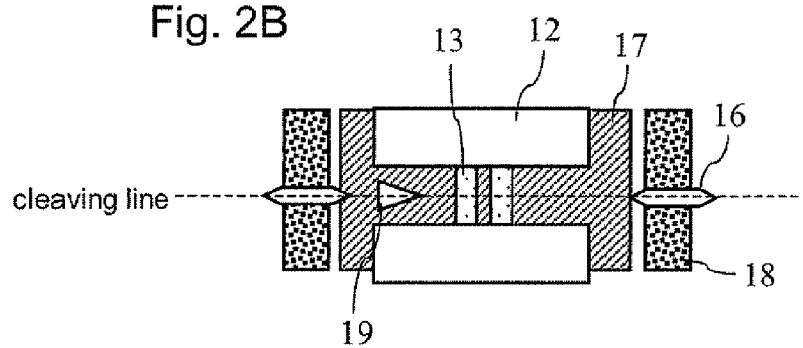
FIG. 2B is an enlarged plan view of a region A shown in FIG. 2A.

FIG. 2A is a perspective view of a GaN wafer having a plurality of semiconductor laser devices formed thereon, provided at step 1 shown in FIG. 1A. Further, FIG. 2B is an enlarged plan view of a region A shown in FIG. 2A.

Referring to FIG. 2A, a GaN wafer 11 has a plurality of semiconductor laser devices formed thereon. A semiconductor laser device comprises an electrode 12, a ridge portion 13 and an insulating film 17. An arrow 14 indicates the resonator direction, and an arrow 15 indicates the cleavage direction or cleavage propagation direction.

Referring further to FIG. 2A, a plurality of scribe marks 16 are formed in the surface of the GaN wafer 11 such that they are disposed at predetermined intervals along the cleavage direction. The scribe marks 16 are referred to as "cuts" in the present invention or in the appended claims. These scribe marks may be formed by cutting the semiconductor layer by a cutter (i.e., from the upper side of FIG. 2A), or they may be formed by electron or laser beam irradiation.

Incidentally, in a GaN wafer, there exist both high dislocation density regions and low dislocation density regions. The high dislocation density region has a very high threading dislocation density and is formed in stripes, and the low dislocation density region has a relatively low threading dislocation density. These high dislocation density regions appear differently from the other regions in a contrast as viewed from the upper or lower surface of the wafer. More specifically, they appear to be stripes having a width of a few to a few tens of microns.

In FIG. 2B, these high dislocation density regions are denoted by reference numeral 18. Scribe marks for facilitating cleavage are formed on them. In general, scribe marks 16 are formed in these high dislocation density regions 18. The present embodiment will be described with reference to an example in which scribe marks 16 are formed on all high dislocation density regions 18. However, the present invention is not limited to this particular arrangement. Scribe marks 16 may be formed only on selected high dislocation density regions 18. For example, every two or every few high dislocation density regions 18 may have scribe marks 16 formed thereon. In the example shown in FIGS. 2A and 2B, a single column of semiconductor laser devices are formed between each two adjacent high dislocation density regions 18. However, it should be noted that the present invention is not limited to such an arrangement. Two or more columns of semiconductor laser devices may be formed between the adjacent high dislocation density regions 18.

The present embodiment is characterized in that a plurality of short grooves, or cuts, 19 are formed in the wafer such that they are in line with the scribe marks 16. More specifically, the grooves 19 are preferably disposed between a ridge portion 13 and the immediately upstream scribe mark 16 relative to the cleavage propagation direction. It should be noted that the grooves 19 might be formed before forming the scribe marks 16. Further, in the example shown in FIGS. 2A and 2B, only one groove 19 is formed between a ridge portion 13 and the immediately upstream scribe mark 16. However, a plurality of grooves 19 may be formed between a ridge portion 13 and the immediately upstream scribe mark 16.

The shape of the grooves 19 as viewed in plan is preferably convexed outwardly toward downstream of the cleavage propagation direction. For example, as shown in FIG. 2B, the grooves 19 may have a triangular shape as viewed in plan. In this case, an apex of the triangle is located on the cleavage line along which the wafer is cleaved. However, the sides of the triangle extending from this apex should not form an angle of 60 degrees with respect to the cleavage line, since GaN crystal tends to cleave in such directions.

Figure 3A:
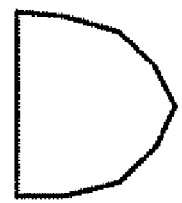
FIGS. 3A to 3C are variations of the groove in a first embodiment of the present invention.
Figure 3B:
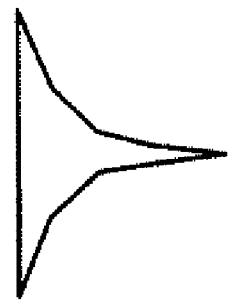
Figure 3C:
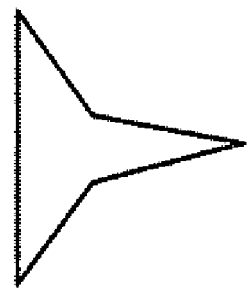

Further, the grooves may have any of the shapes shown in FIGS. 3A to 3C. These shapes are variations of the groove shape shown in FIG. 2B. All of them approximate to a triangle, as viewed in plan, and are designed to avoid causing unintended cleavage. That is, the sides of each shape extending from the apex located on the cleavage line do not form an angle of 60 degrees with the cleavage line. Specifically, the groove shape shown in FIG. 3A differs from that shown in FIG. 2B in that each side extending from the apex thereof on the cleavage line is curved convex outwardly. Further, in the case of the groove shape shown in FIG. 3B, each side extending from such an apex is curved convex inwardly. Further, in the groove shape shown in FIG. 3C, each side extending from the apex on the cleavage line is an inwardly convex curve made up of a plurality of straight line segments (namely, two straight line segments).

It should be noted that the grooves 19 may be disposed on both sides of each ridge portion 13. In such a case, each ridge portion 13 is preferably sandwiched between two different grooves, one having its downstream side (relative to the cleavage propagation direction) convexed outwardly, and the other having its upstream side convexed outwardly.

Figure 4:
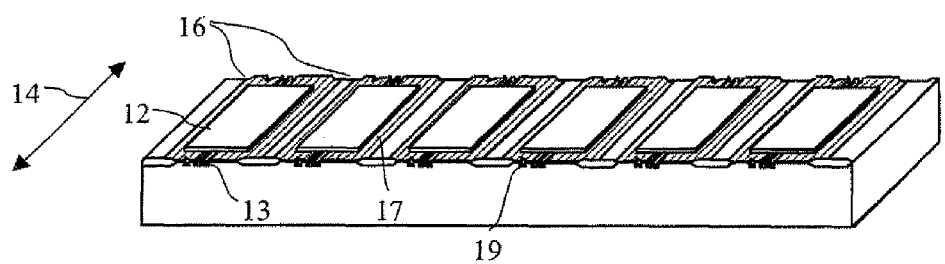
FIG. 4 is a perspective view of a bar produced by cleaving a GaN wafer in a first embodiment of the present invention.
Figure 5A:
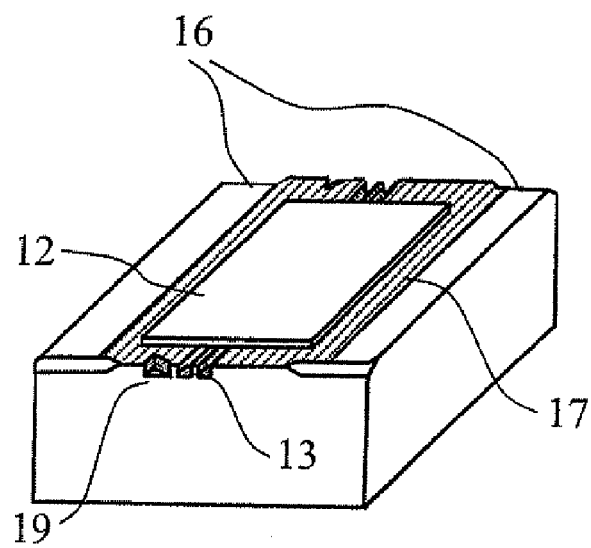
FIG. 5A is a perspective view of a semiconductor laser chip produced by cleaving the bar shown in FIG. 4.
Figure 5B:
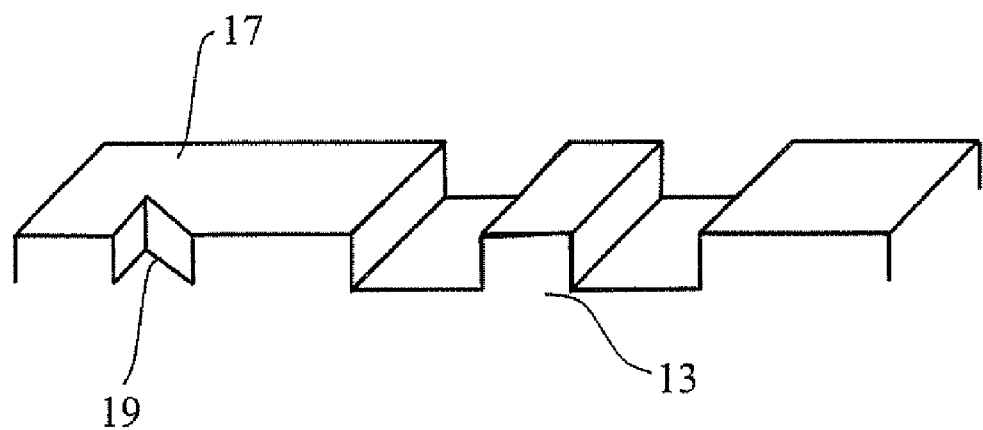
FIG. 5B is an enlarged view of the ridge portion and adjacent portions of the semiconductor laser chip shown in FIG. 5A.

FIG. 4 is a perspective view of a bar produced by cleaving the GaN wafer. Further, FIG. 5A is a perspective view of a semiconductor laser chip produced by cleaving the bar shown in FIG. 4, and FIG. 5B is an enlarged view of the ridge portion and adjacent portions of the semiconductor laser chip shown in FIG. 5A. At the time of these cleaving operations, if stress concentration is present somewhere along the cleavage propagation direction, the resulting cleaved surface may not lie in a desired plane. If the wafer has not been cleaved in a desired plane, the distance between the edges of each semiconductor laser chip and its electrode may vary, resulting in degraded laser characteristics. The present embodiment has been devised to prevent this from occurring. According to the present embodiment as described above, a groove is formed between each ridge portion and the immediately upstream scribe mark relative to the cleavage propagation direction to reduce stress and thereby allow cleavage of the wafer along the desired cleavage line, which enables the semiconductor laser devices to have cleaved surfaces as shown in FIGS. 4, 5A, and 5B.

The distance between each groove 19 and the center of the adjacent ridge portion 13 along the cleavage direction 15 is preferably 10 µm to 50 µm. If this distance is less than 10 µm, the groove 19 may adversely affect light emission from the semiconductor laser device since it is too close to the light-emitting point of the device. On the other hand, if the distance is greater than 50 µm, the effect of the present invention deceases, and the cleavage may occur apart from the desired cleavage line.

Next, a groove forming method of the present embodiment will be described with reference to FIGS. 6A to 6D.

Figure 6A:
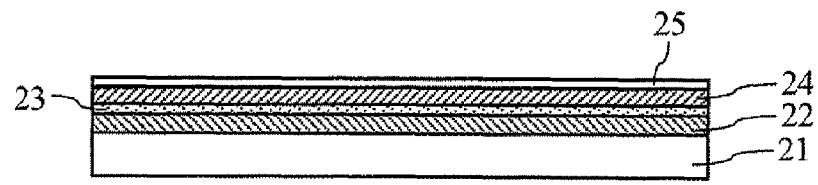
FIGS. 6A to 6D show an example of a groove forming method in a first embodiment of the present invention.
Figure 6B:
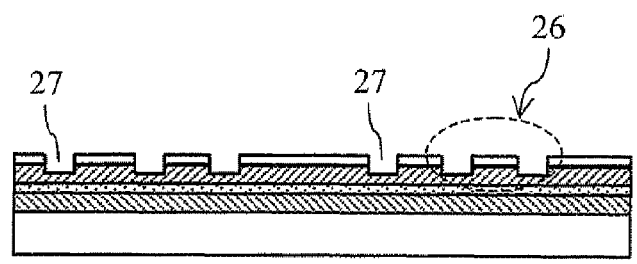
Figure 6C:
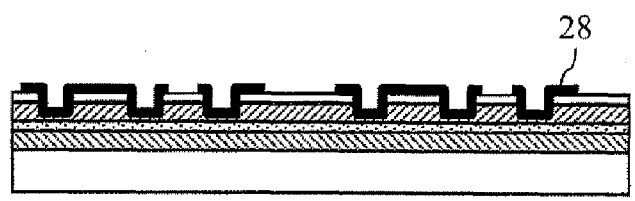
Figure 6D:
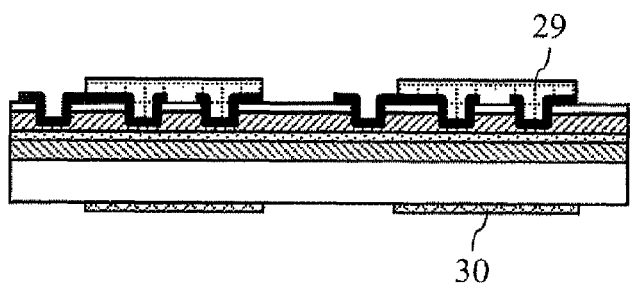

First, onto the surface of a GaN wafer 21, an n-type cladding layer 22, an active layer 23, a p-type cladding layer 24, and a p-type contact layer 25 are formed as shown in FIG. 6A. The p-type contact layer 25 and the p-type cladding layer 24 are then etched by photolithography to form ridge portions 26 and grooves 27, as shown in FIG. 6B. After that, an insulating film 28 is formed on the entire surface except for the top surfaces of the ridge portions 26, as shown in FIG. 6C. Then, electrodes 29 and 30 are formed over the top surfaces of the ridge portions 26 and the lower surface of the GaN wafer 21, respectively, as shown in FIG. 6D, thus completing the formation of semiconductor laser devices.

The groove forming method shown in FIGS. 6A to 6D is advantageous in that the grooves 27 and the ridge portions 26 are formed in the same process so that the total process for manufacturing a semiconductor laser device is not increased.

Another groove forming method of the present embodiment will be described with reference to FIGS. 7A to 7E.

Figure 7A:
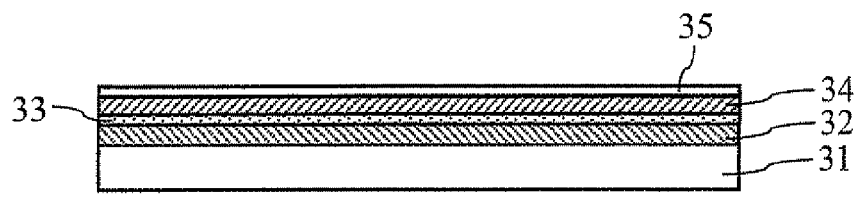
FIGS. 7A to 7E show another example of a groove forming method in a first embodiment of the present invention.
Figure 7B:
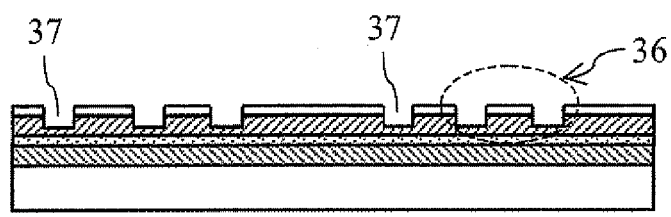
Figure 7C:
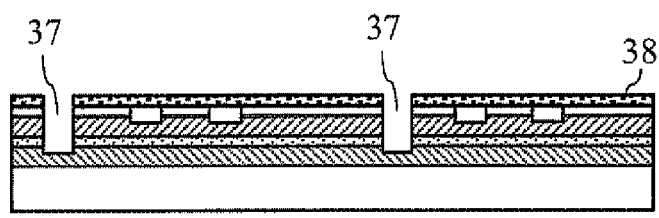
Figure 7D:
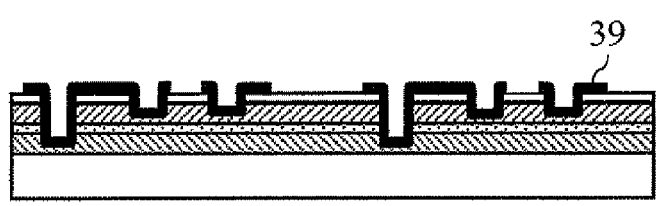
Figure 7E:
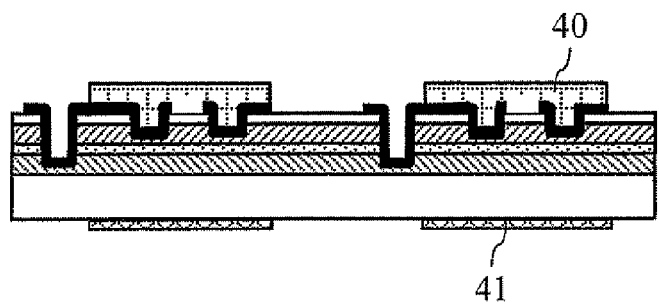

First, onto the surface of a GaN wafer 31, an n-type cladding layer 32, an active layer 33, a p-type cladding layer 34, and a p-type contact layer 35 are formed as shown in FIG. 7A. The p-type contact layer 35 and the p-type cladding layer 34 are then etched by photolithography to form ridge portions 36 and grooves 37, as shown in FIG. 7B. After that, only the grooves 37 are further etched using a mask 38, as shown in FIG. 7C. The mask 38 is then removed since it is no longer necessary, and an insulating film 39 is formed on the entire surface except for the top surfaces of the ridge portions 36, as shown in FIG. 7D. Then, electrodes 40 and 41 are formed over the top surfaces of the ridge portions 36 and the lower surface of the GaN wafer 31, respectively, as shown in FIG. 7E.

The groove forming method shown in FIGS. 6A to 6D forms the grooves 27 and the ridge portions 26 to the same depth. On the other hand, the groove forming method shown in FIGS. 7A to 7E can form the grooves 37 to a larger depth than the depth of the ridge portions 36, since they are formed by separate processes. This further facilitates cleavage of the wafer in a desired plane or direction.

Still another groove forming method of the present embodiment will be described with reference to FIGS. 8A to 8D.

Figure 8A:
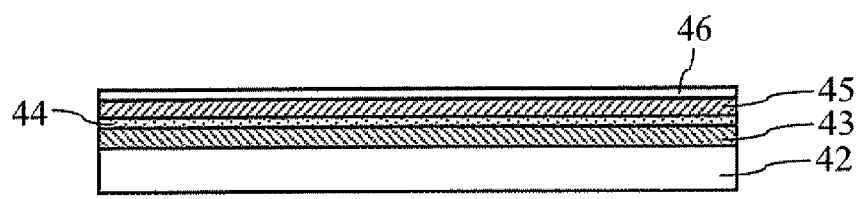
FIGS. 8A to 8D show still another groove forming method in a first embodiment of the present invention.
Figure 8B:
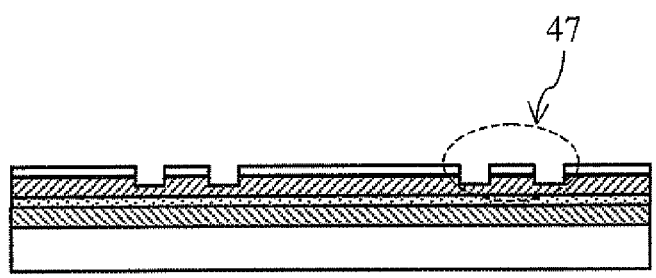
Figure 8C:
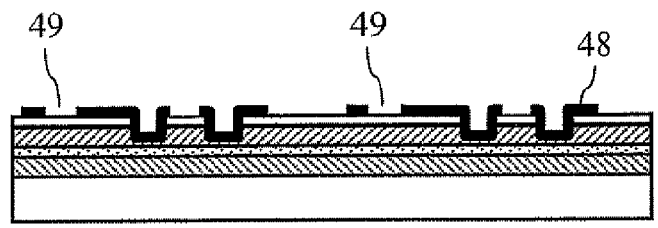
Figure 8D:
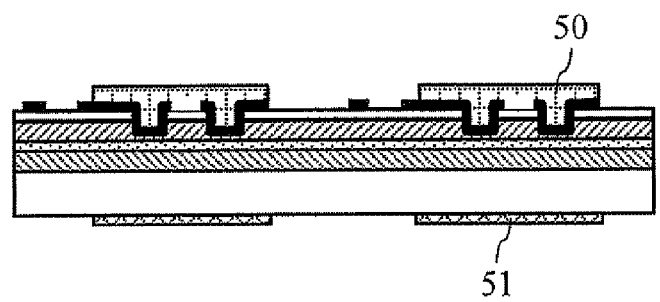

First, onto the surface of a GaN wafer 42, an n-type cladding layer 43, an active layer 44, a p-type cladding layer 45, and p-type contact layer 46 are formed as shown in FIG. 8A. The p-type contact layer 46 and the p-type cladding layer 45 are then etched by photolithography to form ridge portions 47, as shown in FIG. 8B. After that, an insulating film 48 is formed on predetermined portions of the p-type contact layer 46 and the p-type cladding layer 45, and then the insulating film 48 is etched by photolithography to form grooves 49, as shown in FIG. 8C. It should be noted that an alternative way to form the grooves 49 is to avoid forming the insulating film 48 on the portions of the surface of the p-type contact layer 46 that will become the bottom surfaces of the grooves 49. For example, the insulating film 48 is deposited with a mask on these portions, and then the mask is removed to form the grooves 49. After forming the grooves 49, electrodes 50 and 51 are formed over the top surfaces of the ridge portions 47 and the lower surface of the GaN wafer 42, respectively, as shown in FIG. 8D.

The insulating film 48 may be formed of an oxide containing at least one element selected from the group consisting of Si, Ti, V, Zr, Nb, Hf, and Ta. Alternatively it may be formed of SiN, BN, AlN or SiC, etc.

According to the present embodiment as described above, both scribe marks and grooves are formed on a GaN wafer, which facilitates cleavage of the wafer in a desired plane as compared to the case when only scribe marks are formed on the wafer.

Second Embodiment

Figure 9:
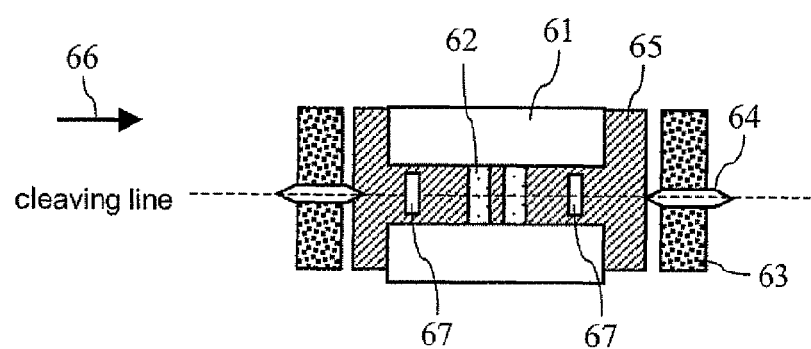
FIG. 9 is an enlarged partial plan view of a semiconductor laser device formed on a GaN wafer before cleavage of the wafer in a second embodiment of the present invention.

FIG. 9 is an enlarged partial plan view of semiconductor laser devices formed on a GaN wafer before cleavage of the wafer.

In FIG. 9, a semiconductor laser device comprised an electrode 61, a ridge portion 62, a high dislocation density region 63, a scribe mark 64 and an insulating film 65. Further, arrow 66 indicates the cleavage propagation direction. Each scribe mark 64 may be formed cutting by a cutter, or it may be formed by electron or laser beam irradiation.

The present embodiment is characterized in that a plurality of short grooves, or cuts, 67 are disposed along the cleavage direction 66. The groove 67 may be disposed between each ridge portion 62 and the immediate scribe marks 64, both upstream and downstream side of the ridge portion 62 along the cleavage propagation direction 66. However, the groove 67 should be disposed at least on the downstream side of the ridge portion 62 relative to the cleavage propagation direction 66. It should be noted that, although in the example shown in FIG. 9 only one groove 67 is disposed on each side of each ridge portion, the present invention is not limited to such an arrangement. A plurality of grooves 19 may be disposed on both sides of each ridge portion, or a plurality of grooves 19 may be disposed only on the downstream side of each ridge portion.

The grooves 67 may have any polygonal shape in plan, such as rectangular or triangular, or a circular shape that allows stress reduction at the time of cleaving. However, the sides of the grooves 67 should not form an angle of 60 degrees with respect to the cleavage line, since GaN crystal tends to cleave in such directions.

The grooves 67 can be formed in the same manner as the grooves in the first embodiment by using any of the groove forming methods shown in FIG. 6A to FIG. 8D.

Figure 10:
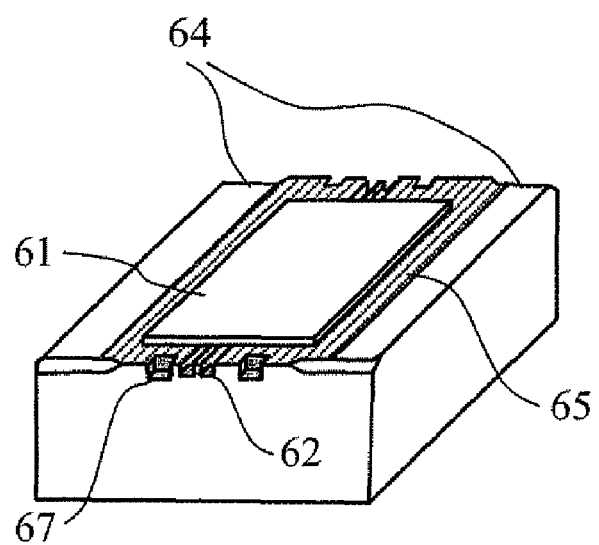
FIG. 10 is a perspective view of a semiconductor laser chip obtained by dividing the bar shown in FIG. 9, which in turn was obtained by cleaving the GaN wafer.

FIG. 10 is a perspective view of a semiconductor laser chip obtained by dividing the bar shown in FIG. 9, which in turn was obtained by cleaving the GaN wafer. In genera, cleavage of a wafer takes place in the following manner. When a cleaving force or pressure is applied to the wafer, stress concentrates on a portion of the wafer having lower cleavage energy, resulting in initiation of cleavage. Then, the cleavage propagates through this portion into other low cleavage energy portions or cleavage susceptible portions. In case where the cleavage direction does not coincide with a crystal orientation of the wafer, or if the shape or positions of the scribe marks are not appropriate, or if the scribe marks along the cleavage line are not in a straight line, the cleaved surface formed in this manner may have a step-like portion. The present embodiment has been devised to prevent this from occurring. According to the present embodiment as described above, forming of a step-like portion near the light-emitting portion of the semiconductor laser device may be avoided owing to the grooves. Thus, the above arrangement allows the semiconductor laser device to have cleaved surfaces as shown in FIG. 10.

Third Embodiment

Figure 11:
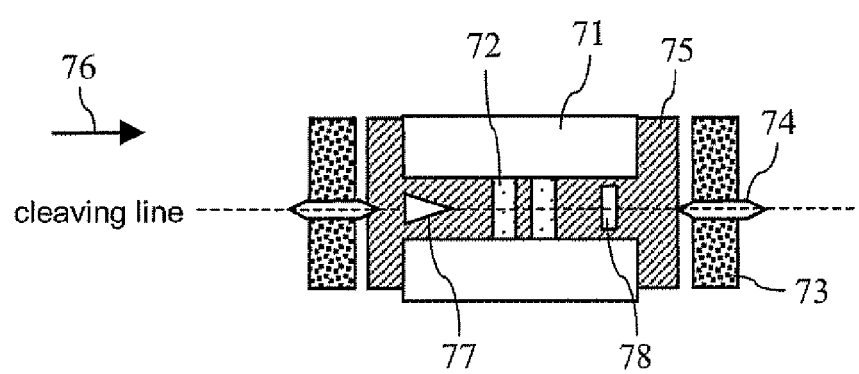
FIG. 11 is an enlarged partial plan view of semiconductor laser devices formed on a GaN wafer before cleavage of the wafer in a third embodiment of the present invention.
Figure 12:
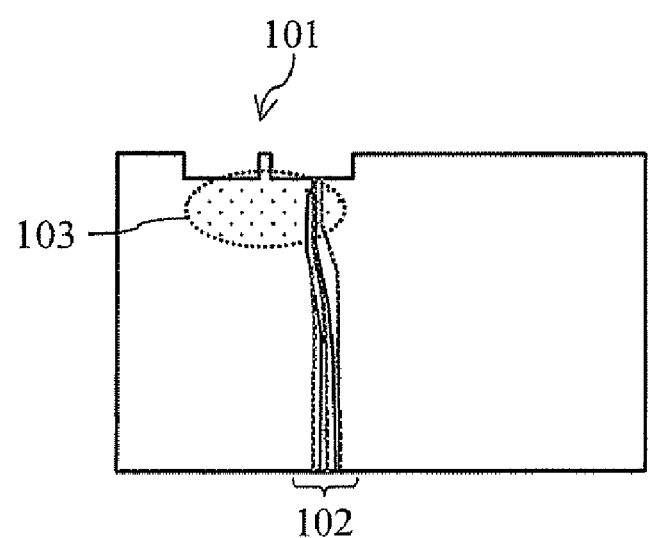
FIG. 12 is a schematic cross-sectional view of a ridge portion having a step-like portion, or streaks, formed due to cleavage.

FIG. 11 is an enlarged partial plan view of semiconductor laser devices formed on a GaN wafer before cleavage of the wafer.

In FIG. 11, a semiconductor laser device comprises an electrode 71, a ridge portion 72, a high dislocation density region 73, a scribe mark 74 and an insulating film 75. Further, arrow 76 indicates the cleavage propagation direction. Each scribe mark 74 may formed by cutting by a cutter, or it may be formed by electron or laser beam irradiation.

The present embodiment is characterized in that first grooves 77 and second grooves 78 are disposed along the cleavage direction 76. It should be noted that each first groove 77 corresponds to each groove 19 of the first embodiment shown in FIG. 2B, while each second groove 78 corresponds to each groove 67 of the second embodiment shown in FIG. 9.

The first grooves 77 are disposed between each ridge portion 72 and the immediately upstream scribe mark 74 relative to the cleavage propagation direction 76. It should be noted that although in the example shown in FIG. 11 only one first groove 77 is disposed between each ridge portion 72 and the immediately upstream scribe mark 74, the present invention is not limited to such an arrangement. A plurality of first grooves 77 may be disposed there.

The shape of the first grooves 77 as viewed in plan has its downstream side convexed outwardly relative to the cleavage propagation direction. For example, as shown in FIG. 11, the first grooves 77 may have a triangular shape, as viewed in plan. In this case, an apex of the triangle is located on the cleavage line along which the wafer cleaved. However, the sides of the triangle extending from this apex should not from an angle of 60 degrees with respect to the cleavage line, since GaN crystal tends to cleave in such directions. It should be noted that the first grooves 77 may have any of the shapes shown in FIGS. 3A to 3C described in connection with the first embodiment.

The second grooves 78 are disposed between each ridge portion 72 and the immediately downstream scribe mark 74 relative to the cleavage propagation direction 76. It should be noted that, although in the example shown in FIG. 11 only one second groove 78 is disposed between each ridge portion 72 and the immediately downstream scribe mark 74, the present invention is not limited to such an arrangement. A plurality of second grooves 78 may be disposed there.

The second grooves 78 may have a rectangular, triangular, or circular shape, as viewed in plan. However, the sides of these second grooves 78 should not form an angle of 60 degrees with respect to the cleavage line, since GaN crystal tends to cleave in such directions.

The first grooves 77 can be formed in the same manner as the grooves of the first embodiment by using any one of the groove forming methods shown in FIGS. 6 to 8. On the other hand, the second grooves 78 may be formed in a same way.

In general, cleavage of a wafer takes place in the following manner. When a cleaving force or pressure is applied to the wafer, stress concentrates on a portion of the wafer having lower cleavage energy, resulting in initiation of cleavage. Then, the cleavage propagates through this portion into other low cleavage energy portions or cleavage susceptible portions. If the wafer has not been cleaved in a desired plane, the distance between the edges of each semiconductor laser chip and its electrode may vary, resulting in degraded laser characteristics. The present embodiment prevents this from occurring by forming first grooves 77 between each ridge portion and the immediately upstream scribe mark 74 relative to the cleavage propagation direction, and allows cleaving of the wafer along a desired cleavage line. Further, the present embodiment also prevents the cleaved surface from having a step-like portion near the light-emitting portion of the semiconductor laser device by forming second grooves 78 between each ridge portion and the immediately downstream scribe mark 74. Thus, according to the present embodiment, the first and second grooves are formed on the wafer in addition to the scribe marks, which allows the wafer to be accurately cleaved in a desired plane and prevents the cleavage from adversely affecting the function of the light-emitting portion.

Fourth Embodiment

Figure 13:
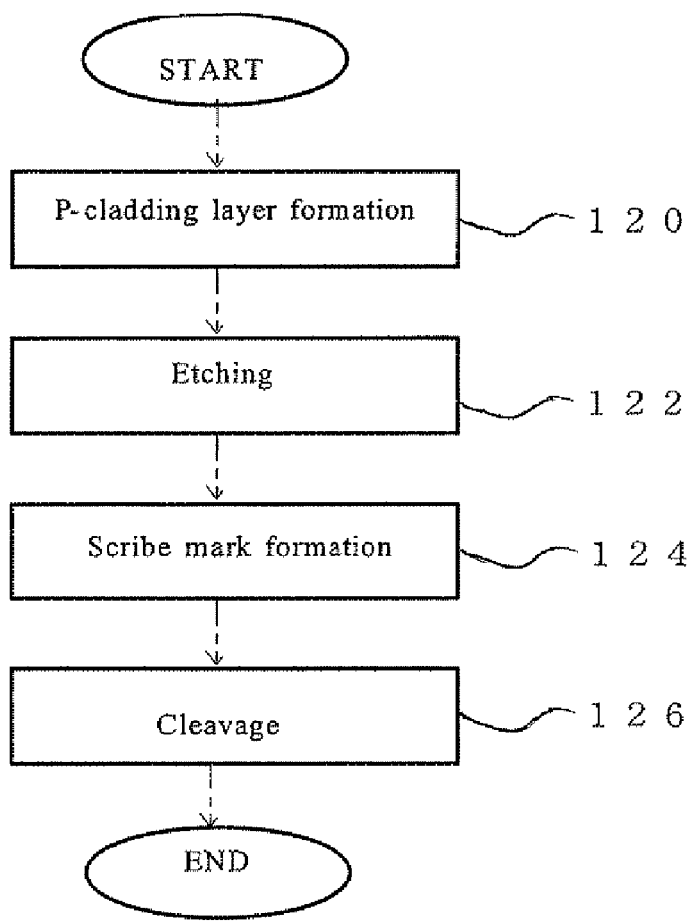
FIG. 13 is flowchart of manufacturing method of semiconductor laser.
Figure 14:
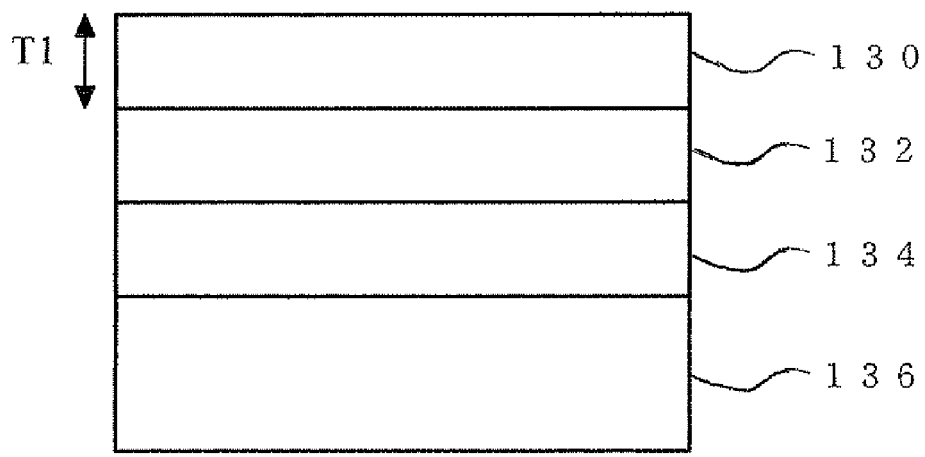
FIG. 14 shows a cross-section of the wafer after step 120 of FIG. 13.

A fourth embodiment of the present invention relates to a method for manufacturing a semiconductor laser in such a way as to optimize the semiconductor layer structure at the leading edge of each scribe mark on the wafer in order to prevent the cleaved surfaces of the ridge and adjacent portions of the semiconductor laser from having a step-like configuration. This manufacturing method will be described with reference to the flowchart shown in FIG. 13. The method begins by providing a single-crystal wafer (136) with an n-type cladding layer (134) and an active layer (132) formed thereon. A p-type cladding layer (130) is then formed on the surface of the wafer at step 120. FIG. 14 shows a cross-section of the wafer after step 120. As shown, the n-type cladding layer 134 is formed on the single-crystal wafer 136, the active layer 132 is formed on the n-type cladding layer 134, and the p-type cladding layer 130 is formed on the active layer 132. The p-type cladding layer 130 has a first thickness T1 after step 120. This thickness T1 is determined by the thickness of the ridge portions to be formed, which in turn is determined to ensure that the semiconductor laser has the desired characteristics.

Next, a resist is applied over the p-type cladding layer 130 (formed at step 120) and patterned by photolithography. The portions of the p-type cladding layer 130 exposed through the resist pattern are then etched at step 122. More specifically, this etching process etches these exposed portions of the p-type cladding layer 130 to a predetermined depth. The other portions of the p-type cladding layer 130 will become ridge portions and terrace portions. It should be noted that the terrace portions have substantially the same height as the ridge portions and serve to protect the ridge portions.

FIG. 15 partially shows the cross-sectional structure of the wafer after the etching at step 122. As shown, step 122 etches portions of the p-type cladding layer other than a ridge portion I, a terrace portion III, and an adjacent ridge portion V to form a ridge 200, a terrace 202, an adjacent ridge 206, etc. Obviously, these unetched portions have the first thickness T1 (the original thickness of the p-type cladding layer 130). The etched portions of the p-type cladding layer include a channel portion II and a scribe mark formation portion IV on which a scribe mark is to be formed. These etched portions have a second thickness T2 (smaller than the first thickness T1). According to the present embodiment, the second thickness T2 is 0.06 μm.

After completion of step 122, the method proceeds to step 124 where a scribe mark (204) is formed on the scribe mark formation portion IV. According to the present embodiment, a scribe mark is a cut at which a cleavage crack is nucleated when cleaving the wafer. Scribe marks may be cut by a cutter, or they be formed by electron or laser beam irradiation. FIG. 16A shows a cross-section of the wafer after the scribe mark 204 has been formed at step 124. FIG. 16B is a plan view of the wafer shown in FIG. 16A. In FIG. 16B, the broken line indicates a cleavage line 201. In the subsequent cleaving step, the wafer is cleaved along this cleavage line in the direction indicated by the arrow in FIG. 16B.

According to the present embodiment, the cross-section of the scribe mark 204 as viewed in FIG. 16A has an inverted triangular shape, that is, the width of the shape decreases with depth into the scribe mark formation portion IV. On the other hand, the scribe mark 204 has a diamond shape in plan view as shown in FIG. 16B. Two apexes of the diamond shape lie on the cleavage line 201. FIG. 16C shows an enlarged view of the scribe mark 204. As shown, the scribe mark 204 includes a pointed portion 209 whose tip coincides with an apex of the above diamond shape. More specifically, the tip of the pointed portion 209 forms the downstream apex of the scribe mark 204 relative to the cleavage propagation direction and lies on the cleavage line 201. The remaining portion of the scribe mark 204 is denoted by reference numeral 211 in FIG. 16C. The entire scribe mark 204, which includes the pointed portion 209 and the portion 211, is a single cut or slit.

The scribe mark 204 is formed in the scribe mark formation portion IV such that the tip of the pointed portion 209 is spaced a distance L1 from the border between the terrace portion III and the scribe mark formation portion IV along the cleavage line 201. (That is, the scribe mark 204 is located to the side of the terrace portion III opposite to the ridge portion I.) The distance L1 is 1 μm or more, although the following description of the present embodiment assumes that it is just 1 μm. The downstream apex of the scribe mark 204, i.e., the tip of the pointed portion 209, is hereinafter referred to as a "cleavage tip." The distance L1 is then the distance between the cleavage tip of the scribe mark 204 and the border between the terrace portion III and the scribe mark formation portion IV. It should be noted that the scribe mark 204 also has its upstream apex on the cleavage line 201. Obviously, the downstream apex (or the cleavage tip) of the scribe mark 204 is closer to the ridge 200 than the upstream apex of the scribe mark 204.

In FIG. 16B, the regions of the p-type cladding layer (130) that have been etched at step 120 are shown lightly shaded. These etched regions have a strip shape, and their width is denoted by reference numeral L2 in FIG. 16B. The width L2 is 1 μm or more, although the following description of the present embodiment assumes that it is just 1 μm.

After completion of step 124, the method proceeds to step 126 where the wafer is cleaved along the cleavage line 201 to expose semiconductor laser end faces. Specifically, at step 126, a force is applied to the back surface of the wafer below the scribe mark 204 so that a cleavage crack nucleates at the scribe mark 204 and propagates in the direction indicated by the arrow in FIG. 16B. This cleavage results in the formation of laser end faces for emitting or reflecting light.

Figure 17A:
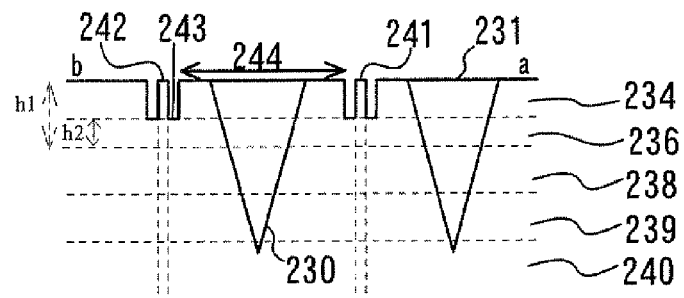
FIG. 17A is a cross-sectional view of the wafer ready to be cleaved.
Figure 17B:
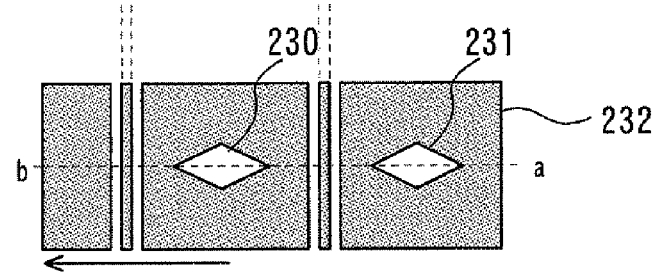
FIG. 17B is a plan view of the wafer shown in FIG. 17A.

To better understand the features of the present invention, it will be helpful to describe a comparative method for manufacturing a semiconductor laser with reference to FIGS. 17A and 17B. FIG. 17A is a cross-sectional view of the wafer ready to be cleaved, and FIG. 17B is a plan view of the wafer shown in FIG. 17A. The comparative method begins by providing a single-crystal wafer 240 with an n-type cladding layer 239 and an active layer 238 successively formed thereon. A p-type cladding layer is then formed on the wafer to a first thickness h1. Next, the p-type cladding layer is partially etched to a second thickness h2 to form a channel 243, a ridge 242, a terrace 244, etc., as shown in FIG. 17A. The second thickness h2 (which is smaller than the first thickness h1) is such that the remaining p-type cladding layer sufficiently protects the active layer 238, etc. and the laser characteristics are optimized. As shown in FIG. 17A, the ridge 242 and the terrace 244 have the first thickness h1 (i.e., the original thickness of the p-type cladding layer), and the channel 243 has the second thickness h2. It should be noted that a ridge 241, etc. belonging to another chip are formed to the side of the terrace 244 opposite to the channel 243, as shown in FIG. 17A.

Next, a scribe mark 230 is formed on the terrace 244 (an unetched portion of the p-type cladding layer), as shown in FIG. 17A. This scribe mark 230 has a diamond shape in plan and has its downstream apex (or cleavage tip) and upstream apex on cleavage line a-b. Thus, the cleavage tip lies on the terrace 244 and is closer to the ridge 242 than the upstream apex. Further, the cleavage tip of the scribe mark 230 is spaced a predetermined distance from the adjacent edge of the terrace 244 along the cleavage line a-b. That is, a thick p-type cladding layer region having the first thickness h1 (i.e., a part of the terrace 244) extends the predetermined distance from the cleavage tip toward the ridge 242 along the cleavage line a-b. It should be noted that a predetermined region which extends from (and adjacent) the cleavage tip along the cleavage line a-b is hereinafter referred to as a "dislocation propagation region." (This dislocation propagation region includes the above p-type cladding layer region.)

After completion of the structure shown in FIG. 17A and 17B, the wafer is cleaved to expose edges. Specifically, a force is applied to the back surface of the wafer below the scribe mark 230 so that a cleavage crack propagates along the cleavage line a-b in the direction indicated by the arrow in FIG. 17B. That is, the cleavage crack nucleates at the cleavage tip of the scribe mark 230 and propagates through the dislocation propagation region, the channel 243, and the ridge 242 in that order.

When a laser is in operation, the light intensity across the active and cladding layers, etc. of the ridge portion is high. If the end faces of these layers have a step-like portion due to improper cleavage, etc., it will degrade the laser characteristics, as is known in the art. Therefore, the wafer must be cleaved in such a way that the active and cladding layers of the ridge, etc. which exhibit high light intensity during laser operation have flat end faces with no step-like portions. However, it has been found that the use of a conventional manufacturing method such as this comparative method may result in the fact that the cleaved end faces of the active and cladding layers of the ridge, etc. which exhibit high light intensity during laser operation have a lateral step-like portion(s) extending substantially parallel to the direction indicated by the arrow in FIG. 17B, for example. Obviously, such a step or step-like portion degrades the flatness of the cleaved surface in the depth direction in FIG. 17A.

It should be noted that the presence of any step-like portion extending in a direction including a lateral component is detrimental to the flatness of the cleaved surface. Such step-like portions are formed at the time of cleaving when dislocations present or generated around the scribe mark propagate into the active and cladding layers of the ridge, etc. which exhibit high light intensity during laser operation. Therefore, the use of the comparative method may result in a semiconductor laser having degraded characteristics due to the presence of such lateral step-like portions.

On the other hand, the method of the present embodiment for manufacturing a semiconductor laser allows the wafer to be cleaved in such a way as to prevent the cleaved surface from having a lateral step-like configuration. The following describes advantageous features of this method with reference to FIGS. 16A and 16B.

According to the method of the present embodiment, the p-type cladding layer in the dislocation propagation region, which extends from the cleavage tip of the scribe mark 204 toward the downstream ridge 200, has a reduced thickness of 0.06 μm as a result of etching. Therefore, for example, when a cleavage crack is nucleated at and propagates from the cleavage tip of the scribe mark 204, the dislocations present or generated around the scribe mark do not propagate parallel to the cleavage direction, but instead they propagate perpendicular thereto toward the surface of the wafer (see FIG. 16A). This prevents the formation of a lateral step-like portion on the cleaved surface, thereby ensuring that the active and cladding layers of the ridge, etc. which exhibit high light intensity during laser operation have flat end faces. Thus, according to the method of the present embodiment for manufacturing a semiconductor laser, the wafer can be cleaved in such a way that the ridge portions have flat end faces.

Generally, cleavage of a material occurs when a cleavage crack nucleates and propagates in a direction in which the material is prone to crack (hereinafter referred to as the "crack-prone direction"). When, as in the present invention, a cleavage crack is nucleated at and propagates from a scribe mark, the dislocations around the scribe mark also propagate along the above crack-prone direction. In the case where the p-type cladding layer in the dislocation propagation region has a large thickness, the crack-prone direction is considered to be a lateral direction, e.g., along the interface between the single-crystal wafer and the n-type cladding layer. On the other hand, when the p-type cladding layer in the dislocation propagation region has a small thickness, the crack-prone direction is considered to be a vertical direction (toward the wafer surface). Therefore, according to the present embodiment, the p-type cladding layer in the dislocation propagation region is etched to a reduced thickness to prevent the dislocations around the scribe mark from propagating in lateral directions. This completes the description of technical advantages of the present embodiment.

The results of an experiment conducted by the present inventors verify these technical advantages of the present embodiment, as described below. First, a wafer such as shown in FIG. 17 described in connection with the comparative method was cleaved, wherein the thickness of the terrace 244 (a portion of the p-type cladding layer) was 0.6 μm. Approximately 70% of the semiconductor laser chips produced was defective in that a cleaved end face(s) of the ridge 242 or other characteristically important portions had a lateral-step-like configuration. Next, a wafer such as shown in FIG. 16A described in connection with the present embodiment was cleaved, wherein the second thickness T2 of the p-type cladding layer was 0.06 μm. None of the semiconductor laser chips produced was found to have the problem as described above. (These semiconductor lasers are general blue-violet ridge structure laser diodes.)

It should be noted that in blue-violet semiconductor lasers with a ridge structure, the remaining thickness of the p-type cladding layer (the upper cladding layer) is usually approximately 0.4 μm to provide the desired far field pattern, etc. Therefore, the p-type cladding layer (or upper cladding layer) in the dislocation propagation region may be etched to a thickness less than 0.4 μm to achieve the effect of the present invention. More preferably, the p-type cladding layer in the dislocation propagation region may have a thickness of 0.1 μm to accommodate variations in the process of forming the p-type cladding layer and in the etching process. That is, avoiding the problem of formation of undesirable step-like portions on the cleaved surface as described above requires only that the second thickness T2 of the p-type cladding layer be less than 0.4 μm. Therefore, the p-type cladding layer may be etched such that its second thickness T2 is 0.06 μm, as described in connection with the present embodiment. However, it is more preferable that the second thickness T2 is 0.1 μm or so to accommodate other factors, such as process variations. It should be noted that according to the present invention there is no lower limit to the second thickness T2 of the p-type cladding layer.

Although, as described above, blue-violet laser diodes were used in the above experiment, the present invention may be applied to laser diodes formed in other material systems. This still achieves, at least to some extent, the advantages of the invention, since the idea of the present invention is based on the fact that the "crack-prone direction" of a material depends on its thickness, etc.

The present invention does not require a separate process to form the dislocation propagation regions, since the ridge and the dislocation propagation region are formed in the same etching process.

The dislocation propagation region is not limited to the shape (defined by the lengths L1 and L2 in FIG. 16) described in connection with the present embodiment. According to the present invention, this region may have any shape that ensures that the p-type cladding layer in the dislocation propagation region has a thickness of 0.06 μm (or more preferably less than 0.4 μm) as described above.

Figure 18A:
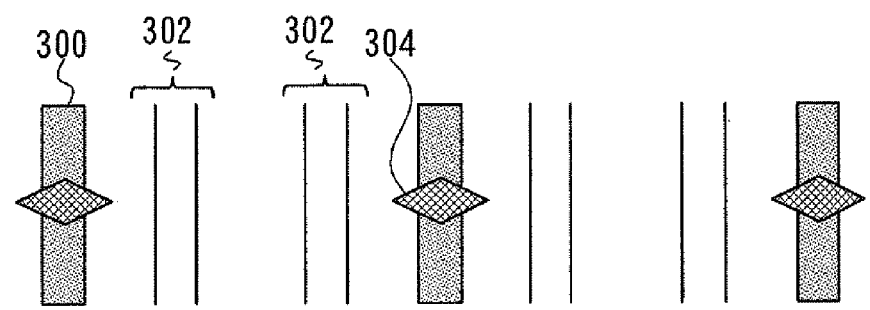
FIGS. 18A and 18B show scribe mark arrangements on the wafer.
Figure 18B:
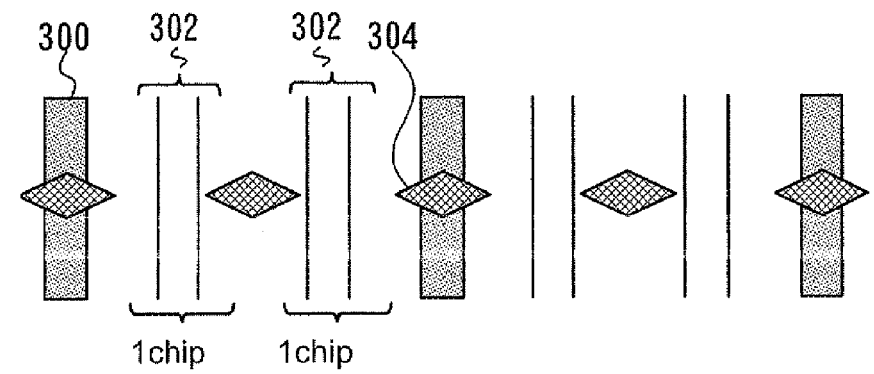

FIG. 17A is a cross-sectional view of the wafer ready to be cleaved, and FIG. 17B is a plan view of the wafer shown in FIG. 17A. In this case, scribe marks (304) may be formed on and across the high dislocation density regions 300, and in such a case the p-type cladding layer in the dislocation propagation regions may have a thickness less than 0.4 μm to achieve the effect of the present invention (see FIG. 18A). Further, the above-described pointed portions of each scribe mark 304 may be disposed on the thinned or etched portions of the p-type cladding layer that are not within the high dislocation density regions 300. This arrangement prevents the cleaved surface (especially those portions near the ridges) from having a step-like configuration. It should be noted that scribe marks may be formed on a place other than the high dislocation density regions, as shown in FIG. 18B. In FIG. 18B, scribe marks are formed such that each chip 302 is sandwiched between two adjacent scribe marks. This arrangement allows the wafer to be cleaved accurately along the cleavage line while achieving the advantages of the present invention.

Figure 19A:
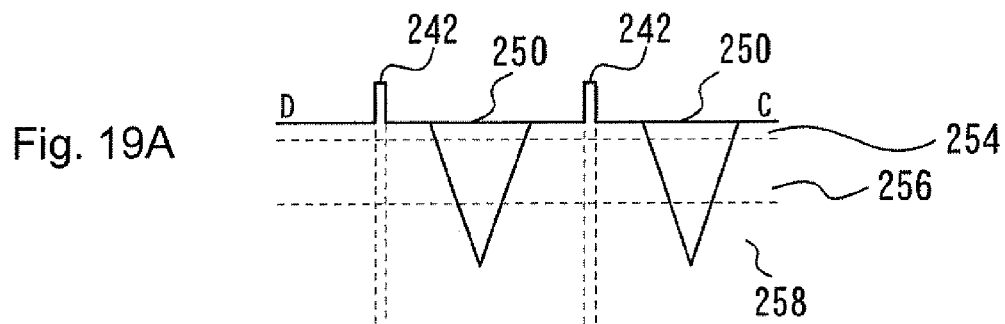
FIGS. 19A and 19B are a cross-sectional view and a plan view, respectively, of a semiconductor laser wafer with no terraces which is ready to be cleaved.
Figure 19B:
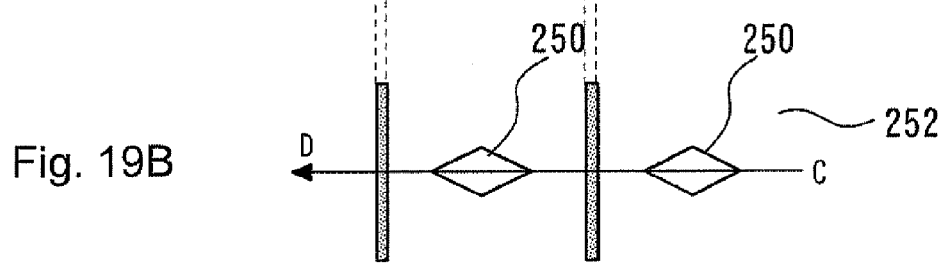

Although the present embodiment has been described in connection with a method for manufacturing a semiconductor laser including terraces, the embodiment may be applied to semiconductor lasers that do not include terraces. FIGS. 19A and 19B are a cross-sectional view and a plan view, respectively, of a semiconductor laser wafer with no terraces which is ready to be cleaved. In this wafer, an active layer 256 is formed on an n-type cladding layer 258, and a p-type cladding layer 254 is formed on the active layer 256. Scribe marks 250 are formed on the thinned portions (or etched portions) of the p-type cladding layer 254, as shown in FIGS. 19A and 19B.

The present embodiment has been described in connection with semiconductor laser wafers in which the upper cladding layer formed on the active layer is a p-type cladding layer. However, the invention may be applied to wafers in which the upper cladding layer is an n-type cladding layer while still retaining the advantages described above.

Figure 20:
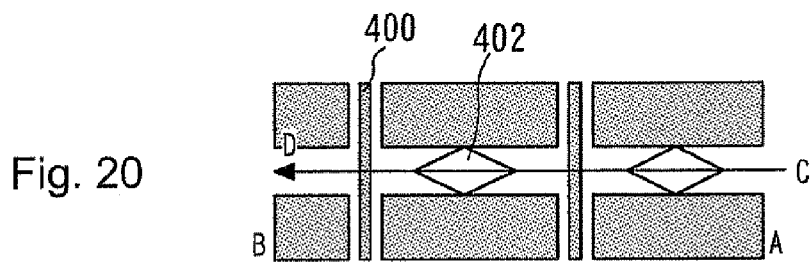
FIG. 20 shows thinned regions formed in the p-type cladding layer by etching.
Figure 21:
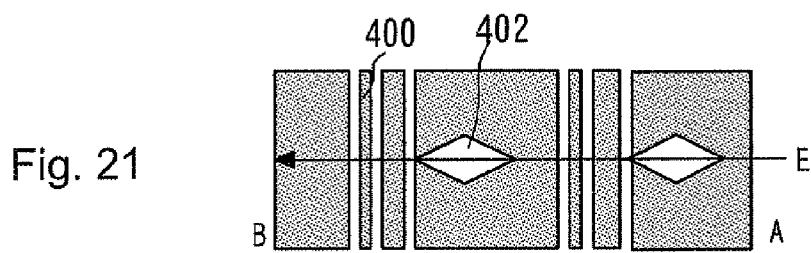
FIGS. 21 and 22 are plan views of other wafers ready to be cleaved according to the present invention.
Figure 22:
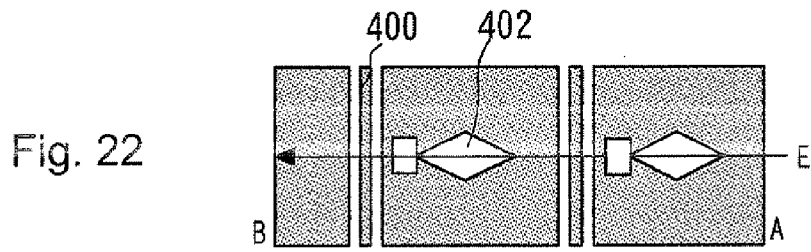

It should be understood that the present invention is not limited to the embodiments described above, and various alterations may be made thereto without departing from the spirit and scope of the invention. For example, thinned regions may be formed in the p-type cladding layer by etching such that they extend between adjacent ridges along the cleavage line and their width is equal to the width of the scribe marks, as shown in FIG. 20. FIG. 20 is a pan view of the wafer ready to be cleaved. Referring to the figure, the scribe marks 402 and the dislocation propagation regions are disposed on etched regions of the p-type cladding layer. In FIG. 20 (and in FIGS. 21 and 22 described later), the ridges 400 and the unetched regions of the p-type cladding layer are shown shaded. FIGS. 21 and 22 are plan views of other wafers ready to be cleaved according to the present invention. It should be noted that in each of FIGS. 20, 21, and 22, the arrow indicates the cleavage line or direction.

The entire disclosure of a Japanese Patent Application No. 2007-35342, filed on Feb. 15, 2007 and Application No. 2008-002879, filed on Jan. 10, 2008 including specification, claims, drawings and summary, on which the Convention priority of the present application is based, are incorporated herein by reference in its entirety.

The invention claimed is:

1. A method for manufacturing a semiconductor laser, comprising:
   providing a GaN substrate having regions of relatively high dislocation density and regions of relatively low dislocation density;
   forming a semiconductor layer on said GaN substrate, said semiconductor layer having a plurality of ridge portions;
   forming a plurality of cuts in said semiconductor layer on said GaN substrate, said cuts being spaced apart at a predetermined interval and at least one of said cuts being located directly opposite one of said high dislocation density regions of said GaN substrate;
   forming at least one groove in said semiconductor layer, between each of said ridge portions and an adjacent one of said cuts, said at least one groove being spaced from and co-linear with said cuts and being located directly opposite one of said low dislocation density regions in said GaN substrate; and
   cleaving said GaN substrate along said plurality of cuts.

2. The method for manufacturing a semiconductor laser as claimed in claim 1, wherein forming said semiconductor layer includes:
   forming at least an n-type cladding layer, an active layer, a p-type cladding layer, and a p-type contact layer on said GaN substrate, in that order; and etching said p-type contact layer and said p-type cladding layer, using photolithography, to form said plurality of ridge portions and said at least one groove.

3. The method for manufacturing a semiconductor laser as claimed in claim 1, wherein forming said semiconductor layer includes:
   forming at least an n-type cladding layer, an active layer, a p-type cladding layer, and a p-type contact layer on said GaN substrate, in that order;
   etching said p-type contact layer and said p-type cladding layer, using photolithography, to form said plurality of ridge portions and said at least one groove; and
   covering said plurality of ridge portions with a mask and further etching said at least one groove.

4. The method for manufacturing a semiconductor laser as claimed in claim 1, wherein forming said semiconductor layer includes:
   forming at least an n-type cladding layer, an active layer, a p-type cladding layer, and a p-type contact layer on said GaN substrate, in that order;
   etching said p-type contact layer and said p-type cladding layer, using photolithography, to form said plurality of ridge portions;
   forming an insulating film on a predetermined portion of said p-type contact layer and a predetermined portion of said p-type cladding layer; and
   etching said insulating film, using photolithography, to form said at least one groove.

5. The method for manufacturing a semiconductor laser as claimed in claim 1, wherein forming said semiconductor layer includes:
   forming at least an n-type cladding layer, an active layer, a p-type cladding layer, and a p-type contact layer on said GaN substrate, in that order;
   etching said p-type contact layer and said p-type cladding layer, using photolithography, to form said plurality of ridge portions; and
   forming an insulating film on a predetermined portion of said p-type contact layer and a predetermined portion of said p-type cladding layer, wherein said at least one groove is formed when forming said insulating film in an area that is not included in either said predetermined portion of said p-type contact layer or in said predetermined portion of said p-type cladding layer.

6. The method for manufacturing a semiconductor laser as claimed in claim 4, wherein said insulating film is an oxide containing at least one element selected from the group consisting of Si, Ti, V, Zr, Nb, Hf, and Ta, or is selected from the group consisting of SiN, BN, AlN, and SiC.

7. The method for manufacturing a semiconductor laser as claimed in claim 1, wherein said at least one groove is formed on a downstream side of a cleavage propagation direction.

8. The method for manufacturing a semiconductor laser as claimed in claim 1, wherein:
   said at least one groove is convex toward a downstream side in a cleavage propagation direction,
   said groove has an apex on a cleavage line, and
   sides of said groove extending from said apex do not form an angle of 60 degrees with respect to the cleavage propagation direction.

9. The method for manufacturing a semiconductor laser as claimed in claim 8, wherein said at least one groove, as viewed in plan, is triangular.

10. The method for manufacturing a semiconductor laser as claimed in claim 8, wherein:
    said at least one groove, as viewed in plan, approximates a triangle; and
    said sides extending from said apex are curved and convex outwardly.

11. The method for manufacturing a semiconductor laser as claimed in claim 8, wherein:
    said at least one groove, as viewed in plan, approximates a triangle; and
    said sides extending from said apex are curved and convex inwardly.

12. The method for manufacturing a semiconductor laser as claimed in claim 8, wherein:
    said at least one groove, as viewed in plan, approximates a triangle; and
    said sides extending from said apex include a plurality of straight line segments and are convex inwardly.

13. The method for manufacturing a semiconductor laser as claimed in claim 1, wherein said at least one groove is formed at least on a downstream side of said ridge portions in a cleavage propagation direction.

14. The method for manufacturing a semiconductor laser as claimed in claim 13, wherein:
    said at least one groove has a rectangular, triangular, or circular shape, as viewed in plan; and
    said at least one groove has no sides that form an angle of 60 degrees with respect to the cleavage propagation direction.

15. A method for manufacturing a semiconductor laser, comprising:
    providing a GaN substrate;
    forming a semiconductor layer on said GaN substrate, said semiconductor layer having a plurality of ridge portions;
    forming a plurality of cuts in said semiconductor layer on said GaN substrate such that said plurality of cuts are spaced at predetermined intervals and each adjacent pair of said plurality of cuts sandwiches one of said plurality of ridge portions;
    forming in said semiconductor layer a first groove and a second groove between each adjacent pair of said plurality of cuts such that said first and second grooves are in line with said plurality of cuts, wherein
    said first groove is formed between one of said plurality of ridge portions and an upstream one of each adjacent pair of said plurality of cuts, relative to a cleavage propagation direction,
    said second groove is formed between one of said plurality of ridge portions and a downstream one of each adjacent pair of said plurality of cuts, relative to the cleavage propagation direction,
    said first groove, as viewed in plan, is convex outwardly toward a downstream side in the cleavage propagation direction, has an apex on a cleavage line, and sides extending from said apex and not forming an angle of 60 degrees with respect to the cleavage propagation direction, and
    said second groove is formed in a rectangular, triangular, or circular shape, as viewed in plan, and has no sides forming an angle of 60 degrees with respect to the cleavage propagation direction; and
    cleaving said GaN substrate along said plurality of cuts.

16. A method for manufacturing a semiconductor laser comprising:
    providing a wafer;
    forming a p-type cladding layer having a first thickness supported by said wafer;
    etching a first predetermined portion and a second predetermined portion of said p-type cladding layer to a second thickness to form a ridge portion, a terrace portion, and a channel portion in said wafer, with said channel portion between and not projecting as far as said ridge and terrace portions, so that said first predetermined portion becomes said channel portion, said second predetermined portion is located on a cleavage line and at a side of said terrace portion, opposite said ridge portion;

forming a scribe mark at a side of said second predetermined portion, opposite said ridge portion, said scribe mark being located on said cleavage line; and cleaving said wafer such that a cleavage crack nucleates at a pointed portion of said scribe mark and propagates through said second predetermined portion, toward said ridge portion, along said cleavage line, wherein said scribe mark has a tip of said pointed portion located on said cleavage line and adjacent said second predetermined portion.

17. The method for manufacturing a semiconductor laser as claimed in claim 16, wherein the length of said second predetermined portion parallel to said cleavage line is at least 1 μm.

18. The method for manufacturing a semiconductor laser as claimed in claim 16, wherein said second predetermined portion has a width perpendicular to said cleavage line of at least 1 μm.

19. The method for manufacturing a semiconductor laser as claimed in claim 16, wherein said second thickness is no more than 0.4 μm.

20. The method for manufacturing a semiconductor laser as claimed in claim 16, further comprising:

forming a plurality of chips on said wafer, each chip including said ridge portion, said terrace portion, and said channel portion; and forming at least one set of said scribe mark and said second predetermined portion between adjacent pairs of said plurality of chips.

21. The method for manufacturing a semiconductor laser as claimed in claim 16, wherein said wafer is a GaN substrate.

22. The method for manufacturing a semiconductor laser as claimed in claim 21, further comprising:

forming a high dislocation density region in said GaN substrate; and forming said scribe mark to lie on and across said high dislocation density region such that an unpointed portion of said scribe mark lies on said high dislocation density region, wherein said pointed portion of said scribe mark is disposed on a portion of said p-type cladding layer, said portion having said second thickness.

* * * * *